(12) United States Patent
Yamauchi

(10) Patent No.: US 6,356,141 B1
(45) Date of Patent: Mar. 12, 2002

(54) CONSTANT-CURRENT OUTPUT CIRCUIT

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/521,461

(22) Filed: Mar. 8, 2000

(30) Foreign Application Priority Data

Jun. 4, 1999 (JP) .......................................... 11-098521

(51) Int. Cl.⁷ ............................. G05F 1/46; H03K 17/16
(52) U.S. Cl. ...................... 327/543; 327/108; 323/312
(58) Field of Search ........................... 327/67, 112, 538, 327/543, 108; 326/33, 34, 93; 330/258, 259; 323/312, 313, 314, 315

(56) References Cited

U.S. PATENT DOCUMENTS

| | | | |
|---|---|---|---|
| 5,187,448 A | * | 2/1993 | Brooks et al. ............... 330/258 |
| 5,418,478 A | | 5/1995 | Van Brunt et al. ............ 326/86 |
| 5,539,771 A | | 7/1996 | Noda et al. .................. 375/219 |
| 5,592,510 A | | 1/1997 | Van Brunt et al. ........... 375/220 |
| 5,644,258 A | | 7/1997 | Wu ............................. 327/110 |
| 5,939,904 A | * | 8/1999 | Fetterman et al. ............ 327/67 |
| 6,034,537 A | * | 3/2000 | Burrows et al. ............... 326/34 |
| 6,107,882 A | * | 8/2000 | Gabara et al. .............. 330/258 |

OTHER PUBLICATIONS

"A CMOS Band–Gap Reference Circuit with Sub 1V Operation", by Banba et al., 1998 Symposium on VLSI Circuits, Digest of Technical Papers, pp. 228–229.

* cited by examiner

Primary Examiner—Kenneth B. Wells
Assistant Examiner—Terry L. Englund
(74) Attorney, Agent, or Firm—McDermott, Will & Emery

(57) ABSTRACT

A driver having a CMOS configuration is connected to a twisted-pair cable so as to perform data transmission by making a change in the direction in which a constant current flows to the cable having two signal lines each coupled to a bias voltage through a terminating resistor. A gate voltage control circuit makes utilization of a detected bias voltage and voltage drops in replica transistors each forming a replica of the terminating resistor for controlling the gate voltage of PMOS and NMOS drive transistors in the driver, whereby the drain current of each of these drive transistors is held at a fixed value.

19 Claims, 16 Drawing Sheets

Fig. 2
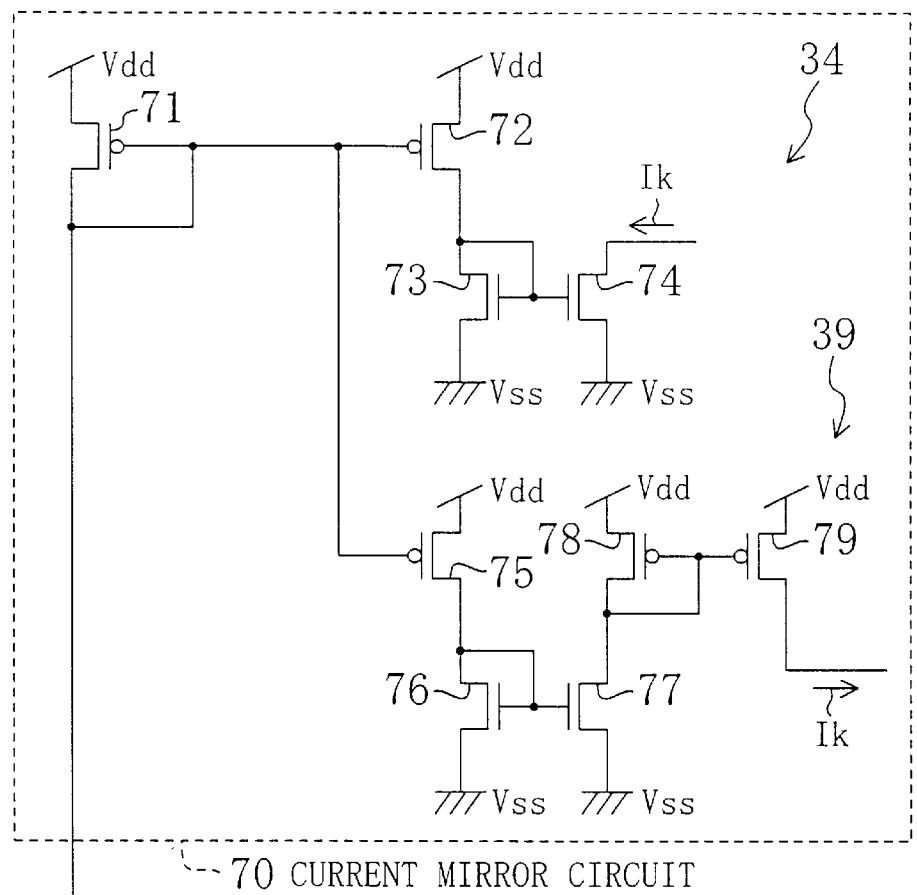
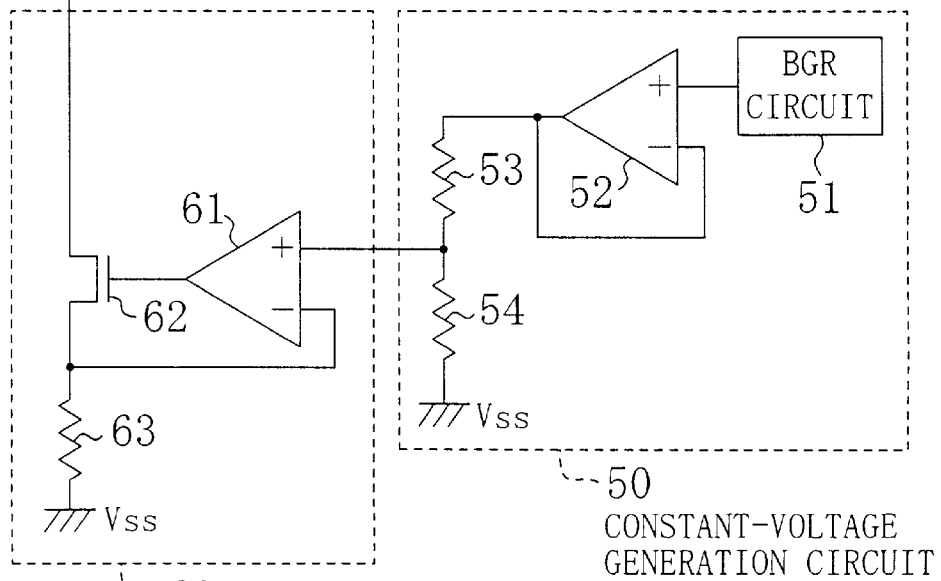

CONSTANT-CURRENT OUTPUT CIRCUIT

BACKGROUND OF THE INVENTION

This invention relates to a constant-current output circuit for outputting a constant current to a cable.

The IEEE 1394 standard defines differential data transmission making use of a twisted-pair cable.

U.S. Pat. No. 5,418,478 discloses a CMOS differential circuit for driving a twisted-pair cable. This circuit is provided with a first PMOS drive transistor having a drain electrode coupled to a first signal line of a cable, a second PMOS drive transistor having a drain electrode coupled to a second signal line of the cable, a first NMOS drive transistor having a drain electrode coupled to the first signal line, and a second NMOS drive transistor having a drain electrode coupled to the second signal line. When the first PMOS drive transistor pours electric current into the first signal line, the current, brought back by way of a terminating resistor and the second signal line, is drawn into the second NMOS drive transistor. When the second PMOS drive transistor pours electric current into the second signal line, the current, brought back by way of the terminating resistor and the first signal line, is drawn into the first NMOS transistor. In other words, the first and second PMOS drive transistors form respective constant-current output circuits for outputting a positive constant current to the cable, and the first and second NMOS drive transistors form respective constant-current output circuits for outputting a negative constant current to the cable.

Then, it is designed such that each of the two signal lines of the cable is coupled, through a terminating resistor Rt, to a bias voltage Vm. Here, Vdd and Vss are power supplies for the constant-current output circuits. The power supply Vdd provides a fixed power-supply voltage (for example, a positive voltage of +2.5 V, to each of source electrodes of the first and second PMOS drive transistors. The power supply Vss provides a fixed power-supply voltage, (for example, a ground voltage of 0 V) to each of source electrodes of the first and second NMOS drive transistors. The bias voltage Vm of the cable, viewed from the power supply Vdd, varies according to the potential of equipment that is connected to the other end of the cable. Likewise, the cable bias voltage Vm, viewed from the power supply Vss, varies according to the potential of the other cable end equipment. For example, in the case the ground voltage of the other cable end equipment is higher than the voltage of the power supply Vss of a constant-current output circuit in point, the bias voltage Vm, viewed from the power supply Vdd of that constant-current output circuit, becomes smaller. If the drain-source voltage of each of the first and second PMOS drive transistors becomes too small due to such variation in the bias voltage Vm, then the operation points of these transistors each move from the saturation region to the linear region as long as their gate-source voltage is maintained at a fixed value, as a result of which constant current output will no longer be maintained. Conversely, in the case the ground voltage of the other cable end equipment is lower than the voltage of the power supply Vss of a constant-current output circuit in point, the bias voltage Vm, viewed from that power supply Vss, becomes smaller. If the drain-source voltage of each of the first and second NMOS drive transistors becomes too small due to such variation in the bias voltage Vm, then the operation points of these transistors each move from the saturation region to the linear region as long as their gate-source voltage is maintained at a fixed value, as a result of which constant current output will no longer be maintained. Further, there may be a case in which the bias voltage Vm of the cable is intentionally changed for the communication of data transmission rate set information and electric power management information, and also in such a case, the same problem arises.

SUMMARY OF THE INVENTION

Accordingly, an object of the present invention is to provide a constant-current output circuit capable of maintaining a constant current drive capability, regardless of the variation in cable bias voltage.

In order to accomplish the object, the present invention provides a constant-current output circuit for outputting a constant current to a cable coupled, through a terminating resistor, to a bias voltage. In this constant-current output circuit, a drive transistor for outputting a current to the cable is provided, and when a change in bias voltage of the cable causes the drain-source voltage of the drive transistor to vary, a variation in drain current of the drive transistor accompanied by such voltage variation is compensated and the current drive capability of the drive transistor is adjusted so as to establish a substantial correspondence between a drain current of the drive transistor and the constant current. Adjustment to the current drive capability is made by controlling, for example, the gate or substrate voltage of the drive transistor. Such adjustment is carried out on the basis of a result of the detection of changes in bias voltage of the cable or on the basis of the system information indicative of a prediction of the change in bias voltage of the cable.

The drive transistor in the constant-current output circuit of the present invention can be replaced by a driver formed by a plurality of drive transistors connected together in parallel. Adjustment to the current drive capability of the driver is made by digital control of the number of transistors which are subjected to activation or by analog control of the gate voltage of a particular transistor.

BRIEF DESCRIPTION OF THE DRAWINGS

FIG. 2 is a block diagram showing an example of the configuration of a constant current source in FIG. 1.

DETAILED DESCRIPTION OF THE INVENTION

Figure 1:
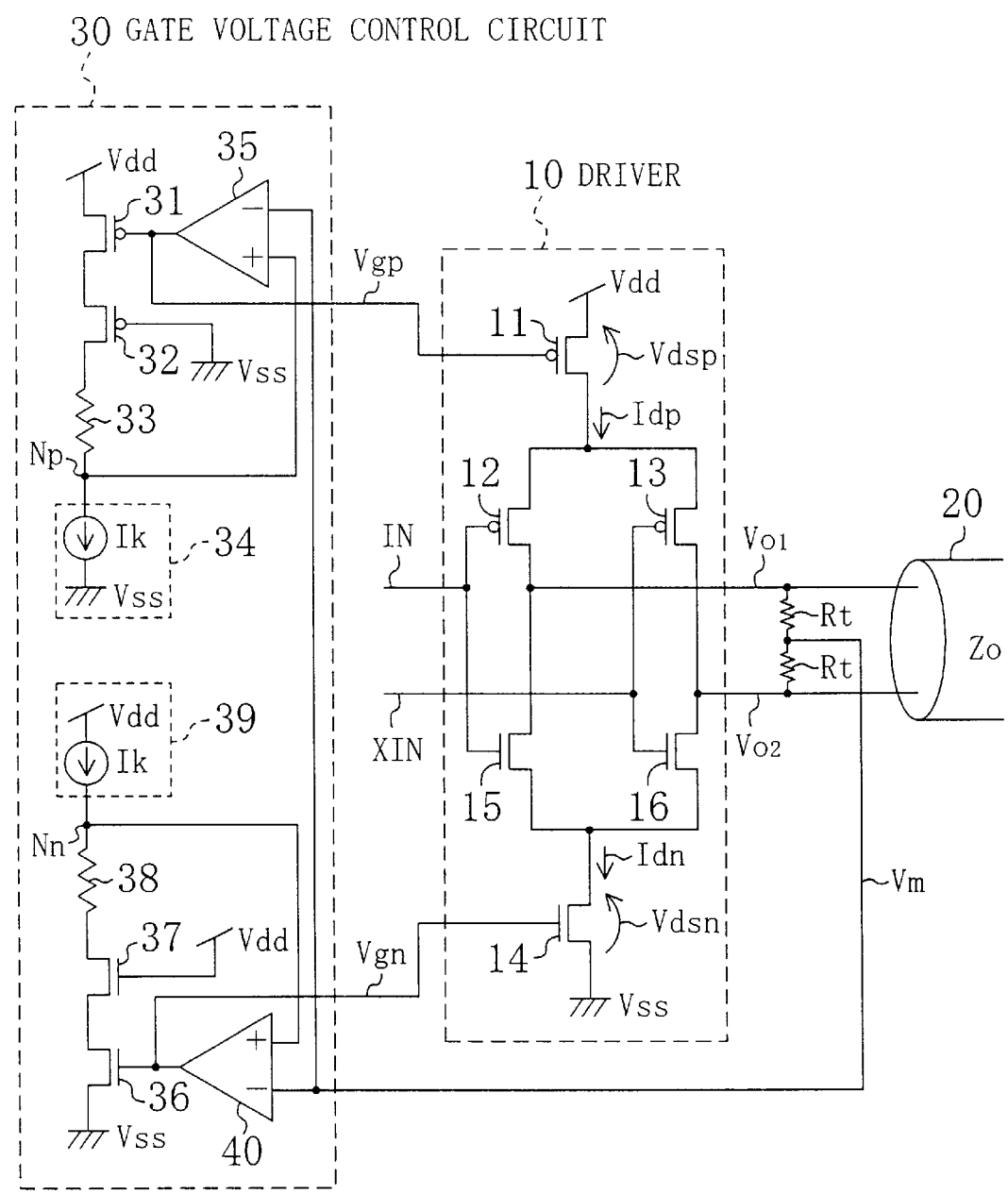
FIG. 1 is a block diagram showing an example of the configuration of a constant-current output circuit according to the present invention.

Referring first to FIG. 1, there is shown an example of the configuration of a constant-current output circuit according to the present invention. A driver 10 and a gate voltage control circuit 30, shown in FIG. 1, together form a constant-current output circuit for outputting a constant current to a twisted-pair cable 20 (hereinafter called simply the cable) having a characteristic impedance Zo. Two signal lines of the cable 20 are coupled, through respective terminating resistors Rt, to a bias voltage Vm. For example, Zo=110 and Rt=55. Here, the value of the bias voltage Vm is determined by equipment that is connected to the other end of the cable 20.

The driver 10 for outputting a current to the cable 20 comprises a PMOS drive transistor 11, first and second PMOS switching transistors 12 and 13, an NMOS drive transistor 14, and first and second NMOS switching transistors 15 and 16. The PMOS drive transistor 11 is a transistor having a gate electrode for receiving a gate voltage Vgp, a source electrode for receiving from a power supply Vdd a constant power-supply voltage (for example, a positive voltage of +2.5 V), and a drain electrode which is coupled, through the first PMOS switching transistor 12, to a first signal line of the cable 20 and which is coupled, through the second PMOS switching transistor 13, to a second signal line of the cable 20, whereby a drain current Idp (for example, 4 mA) pours into the cable 20. The NMOS drive transistor 14 is a transistor having a gate electrode for receiving a gate voltage Vgn, a source electrode for receiving from a power supply Vss a constant power-supply voltage (for example, a ground voltage of 0 V), and a drain electrode which is coupled, through the first NMOS switching transistor 15, to the first signal line of the cable 20 and which is coupled, through the second NMOS switching transistor 16, to the second signal line of the cable 20, whereby a drain current Idn (for example, 4 mA) is drawn in from the cable 20. A data signal IN is applied to a gate electrode of the first PMOS switching transistor 12 and to a gate electrode of the first NMOS switching transistor 15, and a complementary data signal XIN is applied to a gate electrode of the second PMOS switching transistor 13 and to a gate electrode of the second NMOS switching transistor 16. As a result, if IN=L and XIN =H, then a current is poured from the power supply Vdd into the cable 20 through the PMOS drive transistor 11 and the first PMOS switching transistor 12 and the current is drawn into the power supply Vss from the cable 20 through the second NMOS switching transistor 16 and the NMOS drive transistor 14. If the voltages of output nodes of the driver 10 are Vo1 and Vo2, then Vo1>Vo2. Moreover, if IN=H and XIN=L, then a current is poured from the power supply Vdd into the cable 20 through the PMOS drive transistor 11 and the second PMOS switching transistor 13 and the current is drawn into the power supply Vss from the cable 20 through the first NMOS switching transistor 15 and the NMOS drive transistor 14. In this case, Vo1<Vo2.

Which equipment is coupled to the other end of the cable 20 is indeterminate. In other words, the bias voltage Vm of the cable 20, viewed from the driver 10, varies depending on the ground voltage of the other cable end equipment. Moreover, there is a case in which the other cable end equipment intentionally changes its bias voltage Vm. This therefore results in causing Vdsp (the drain-source voltage of the PMOS drive transistor 11) and Vdsn (the drain-source voltage of the NMOS drive transistor 14) to undergo a change. The gate voltage control circuit 30 is provided to prevent the drain currents Idp and Idn from varying even when the drain-source voltages Vdsp and Vdsn change in the way described above. The gate voltage control circuit 30 is to make adjustments to the current drive capability of the driver 10 by controlling the gate voltages Vgp and Vgn in such a way that a variation in output current of the driver 10 due to a change in the bias voltage Vm is compensated. This is explained in detail as follows. That is, the gate voltage control circuit 30 has (a) a series circuit placed between the power supply Vdd and a reference node Np which is formed of a first PMOS replica transistor 31 which forms a replica of the PMOS drive transistor 11, a second PMOS replica transistor 32 which forms a replica of the first and second PMOS switching transistors 12 and 13, and a replica resistor 33 which forms a replica of the terminating resistor Rt, (b) a constant current source 34 for drawing a constant current Ik from the series circuit into the power supply Vss, and (c) an operational amplifier 35 which detects the bias voltage Vm of the cable 20 for controlling the gate voltage of the first PMOS replica transistor 31 thereby to establish correspondence between the voltage of the reference node Np and the bias voltage Vm, and for providing the gate voltage Vgp thus controlled to the gate electrode of the PMOS drive transistor 11. Additionally, the gate voltage control circuit 30 has (a) a series circuit placed between the power supply Vss and a reference node Nn which is formed of a first NMOS replica transistor 36 which forms a replica of the NMOS drive transistor 14, a second NMOS replica transistor 37 which forms a replica of the first and second NMOS switching transistors 14 and 15, and a replica resistor 38 which forms a replica of the terminating resistor Rt, (b) a constant current source 39 for drawing the constant current Ik from the power supply Vdd to the series circuit, and (c) an operational amplifier 40 which detects the bias voltage Vm of the cable 20 for controlling the gate voltage of the first NMOS replica transistor 36 thereby to establish correspondence between the voltage of the reference node Nn and the bias voltage Vm, and for providing the gate voltage Vgn thus controlled to the gate electrode of the NMOS drive transistor 14. If a real number that satisfies k≧1 is k, then the magnitude of the current Ik is 1/k times the output current of the driver 10, and the replica transistors 31, 32, 36, and 37 have gate widths 1/k times those of their main body transistors and the replica resistors 33 and 38 have resistance values k times those of the terminating resistors Rt.

FIG. 2 illustrates examples of the configurations of the constant current sources 34 and 39. In FIG. 2, reference numerals 50, 60, and 70 denote a constant-voltage generation circuit, a constant current generation circuit, and a current mirror circuit, respectively. The constant-voltage generation circuit 50 comprises a BGR (Band-Gap Reference) circuit 51, an operational amplifier 52, and two resistors 53 and 54. For example, as reported by H. Banba et al. in "A CMOS Band-Gap Reference Circuit with Sub IV Operation", 1998 Symposium On VLSI Circuits, Digest of Technical Papers, pp. 228–229, the BGR circuit 51 is a circuit capable of generating a constant voltage independent of the change in temperature, the change in power-supply voltage, and the like. The constant current generation circuit 60 comprises an operational amplifier 61, an NMOS transistor 62, and a replica resistor 63 which forms a replica of the terminating resistor Rt. The current mirror circuit 70 comprises five PMOS transistors 71, 72, 75, 78, and 79 and four NMOS transistors 73, 74, 76, and 77.

Figure 3:
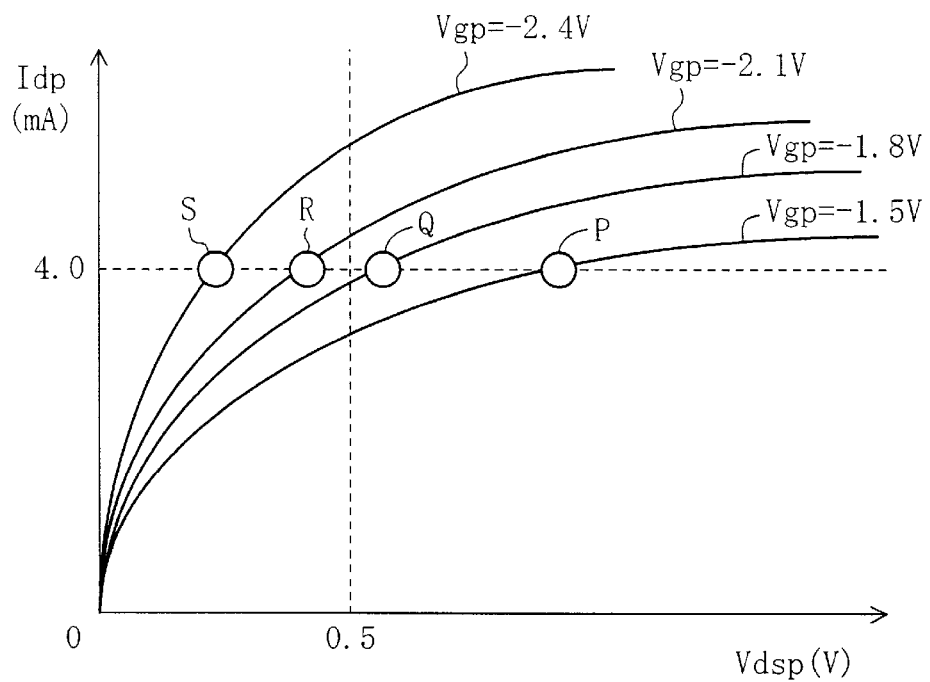
FIG. 3 is a diagram showing a change of the operation point of a PMOS transistor in FIG. 1.

FIG. 3 shows a change of the operation point of the PMOS drive transistor 11 in FIG. 1. According to the configuration of FIG. 1, as Vdsp decreases the deeper bias Vgp is applied to the gate electrode of the PMOS drive transistor 11, as a result of which the operation point moves to P, to Q, to R, and then to S. This therefore makes it possible for the drain current Idp to maintain a fixed value. For example, on the assumption that the gate voltage Vgp (=−1.5 V) at the operation point P is held as in conventional technology, the operation point will move from a saturation region to a liner region when Vdsp becomes smaller than 0.5 V, and Idp will have decreased.

Figure 4:
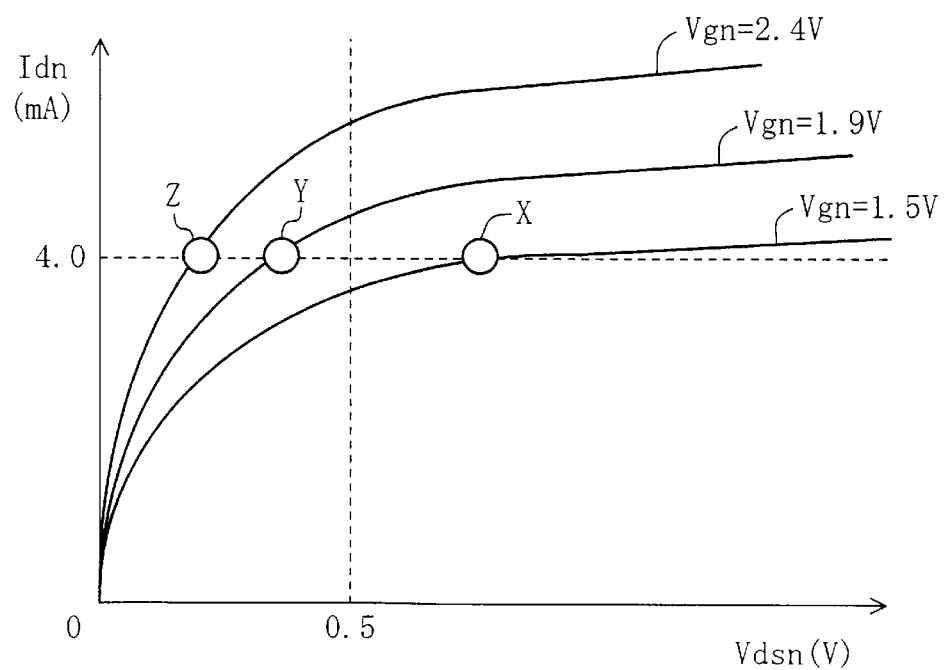
FIG. 4 is a diagram showing a change of the operation point of an NMOS transistor in FIG. 1.

FIG. 4 shows a change of the operation point of the NMOS drive transistor 14 in FIG. 1. According to the configuration of FIG. 1, as Vdsn decreases the higher bias Vgn is applied to the gate electrode of the NMOS drive transistor 14, as a result of which the operation point moves to X, to Y, and then to Z. This therefore makes it possible for the drain current Idn to maintain a fixed value.

As described above, the configuration of FIG. 1 enables a data transmission system to perform stable operations by changing the direction in which a constant current flows in the cable. Moreover, there is the effect that noise accompanied by the change in current flowing in a power supply line or a ground line becomes avoidable.

Additionally, it is possible to adopt a driver configuration which is implemented by dividing the PMOS drive transistor 11 of FIG. 1 into two portions and then bringing these two portions into series connection with the switching transistors 12 and 13, respectively. The same is applicable to the NMOS drive transistor 14. In such a case, an arrangement can be made in which in each drive/switching transistor pair the drive transistor changes positions with the switching transistor.

Figure 5:
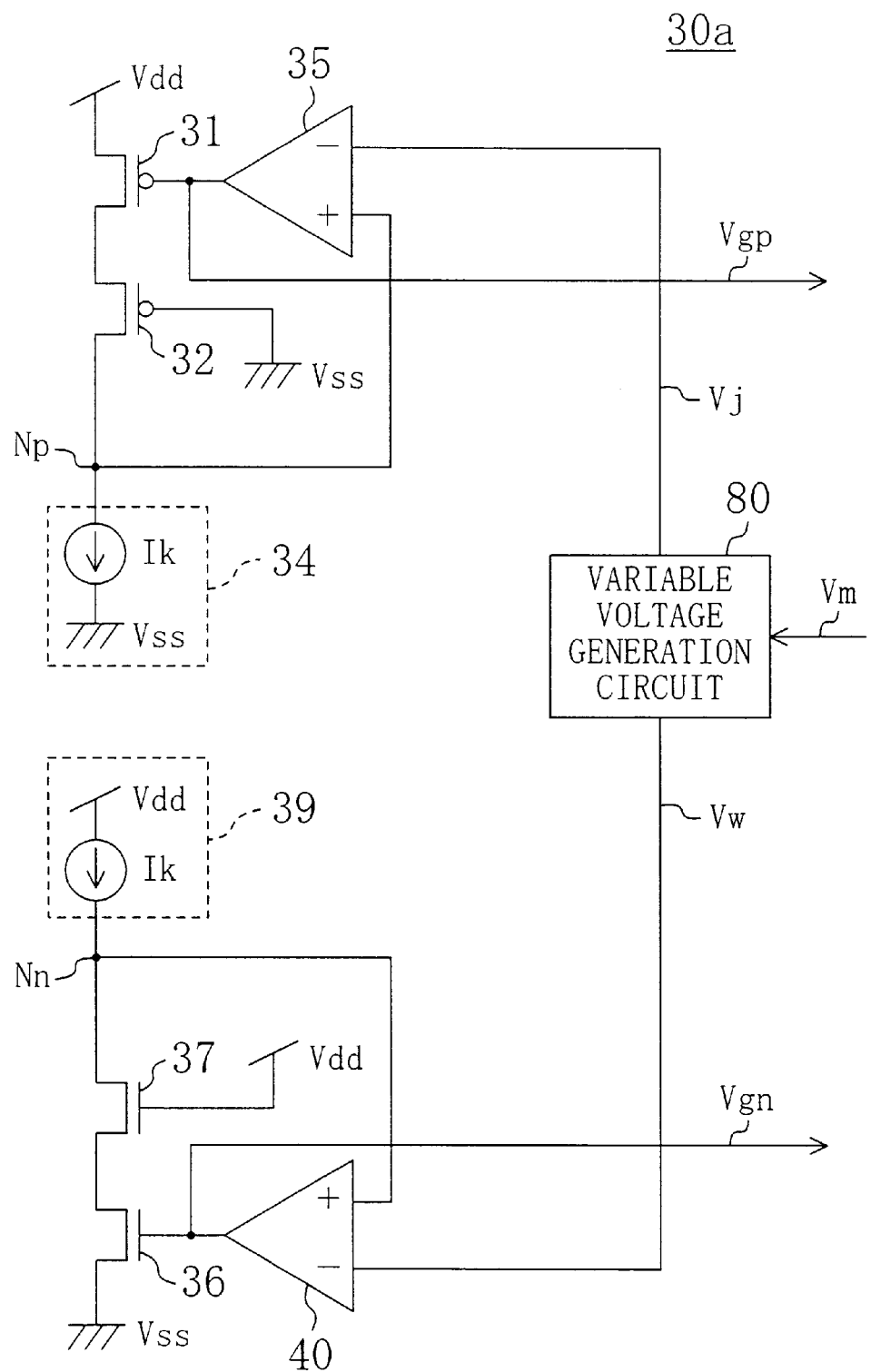
FIG. 5 is a circuit diagram showing a variation example of a gate voltage control circuit in FIG. 1.

Referring to FIG. 5, there is shown a variation example of the gate voltage control circuit 30 in FIG. 1. In a gate voltage control circuit 30a of FIG. 5, a variable voltage generation circuit 80 is provided in place of the replica resistors 33 and 38 in FIG. 1. This variable voltage generation circuit 80 is a circuit for detecting the cable bias voltage Vm and for generating from the detected cable bias voltage Vm first and second variable voltages Vj and Vw. Here, voltage differences Vj−Vm and Vm−Vw represent a voltage drop at the terminating resistor Rt (for example, 2 mA×55Ω=0.11 V).

Figure 6:
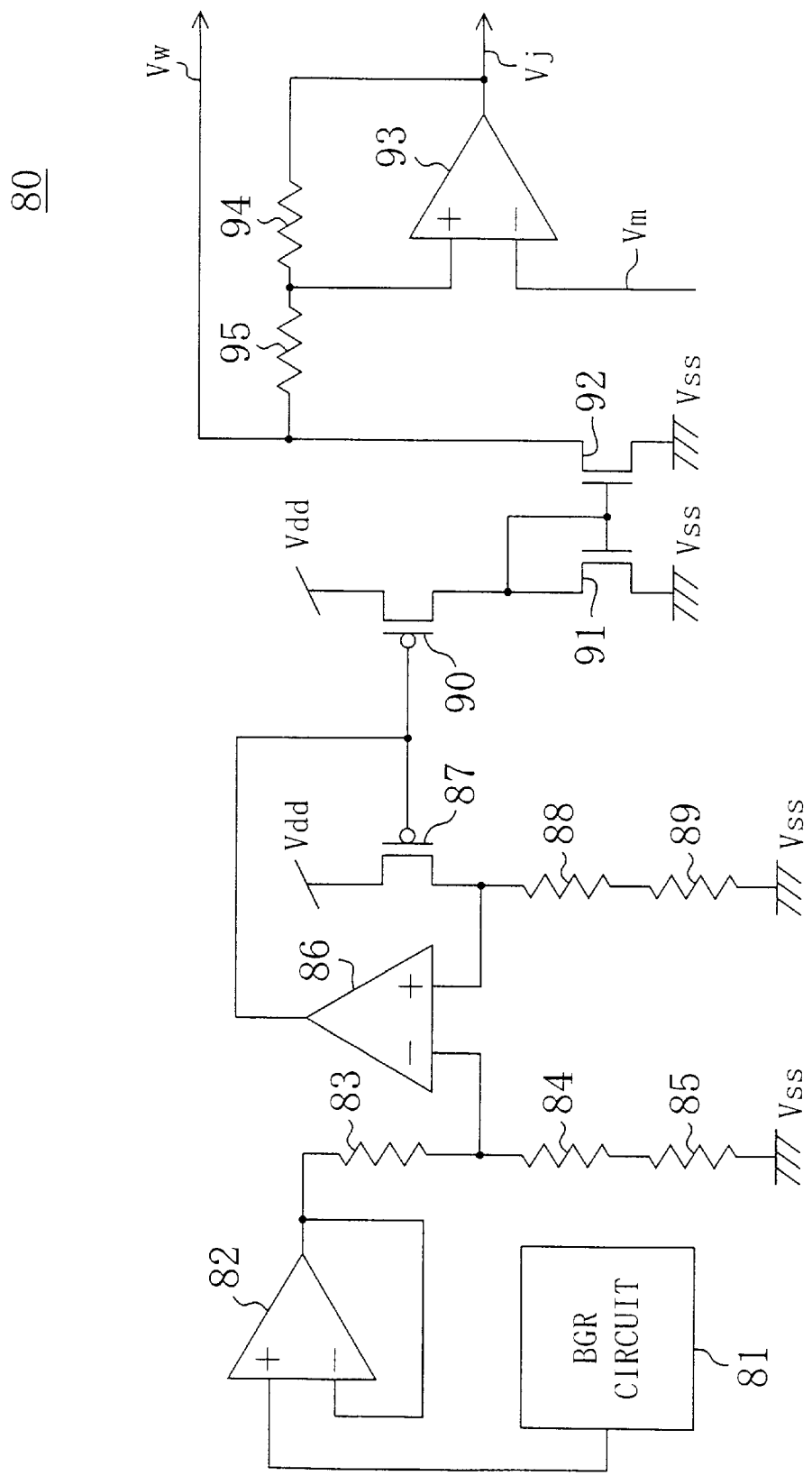
FIG. 6 is a circuit diagram showing an internal configuration of a variable voltage generation circuit in FIG. 5.

FIG. 6 shows an internal configuration of the variable voltage generation circuit 80 in FIG. 5. The variable voltage generation circuit 80 of FIG. 6, which is provided with first and second replica resistors 94 and 95 forming a replica of the terminating resistor Rt, flows a constant current into both the replica resistors 94 and 95, and generates (a) the first variable voltage Vj by adding a voltage drop in the first replica resistor 94 to the bias voltage Vm and (b) the second variable voltage Vw by subtracting a voltage drop in the second replica resistor 95 from the bias voltage Vm. These addition and subtraction operations are executed in an adder-subtracter circuit formed by an operational amplifier 93 and both the replica resistors 94 and 95. Other constitutional elements in FIG. 6 form a constant current source similar to the one shown in FIG. 2 for flowing a constant current into both the replica resistors 94 and 95. 81 is a BGR circuit. 82 and 86 are operational amplifiers. 83 is a resistor. 84, 85, 88, and 89 are replica resistors forming a replica of the terminating resistor Rt. 87 and 90 are PMOS transistors. 91 and 92 are NMOS transistors.

Figure 7:
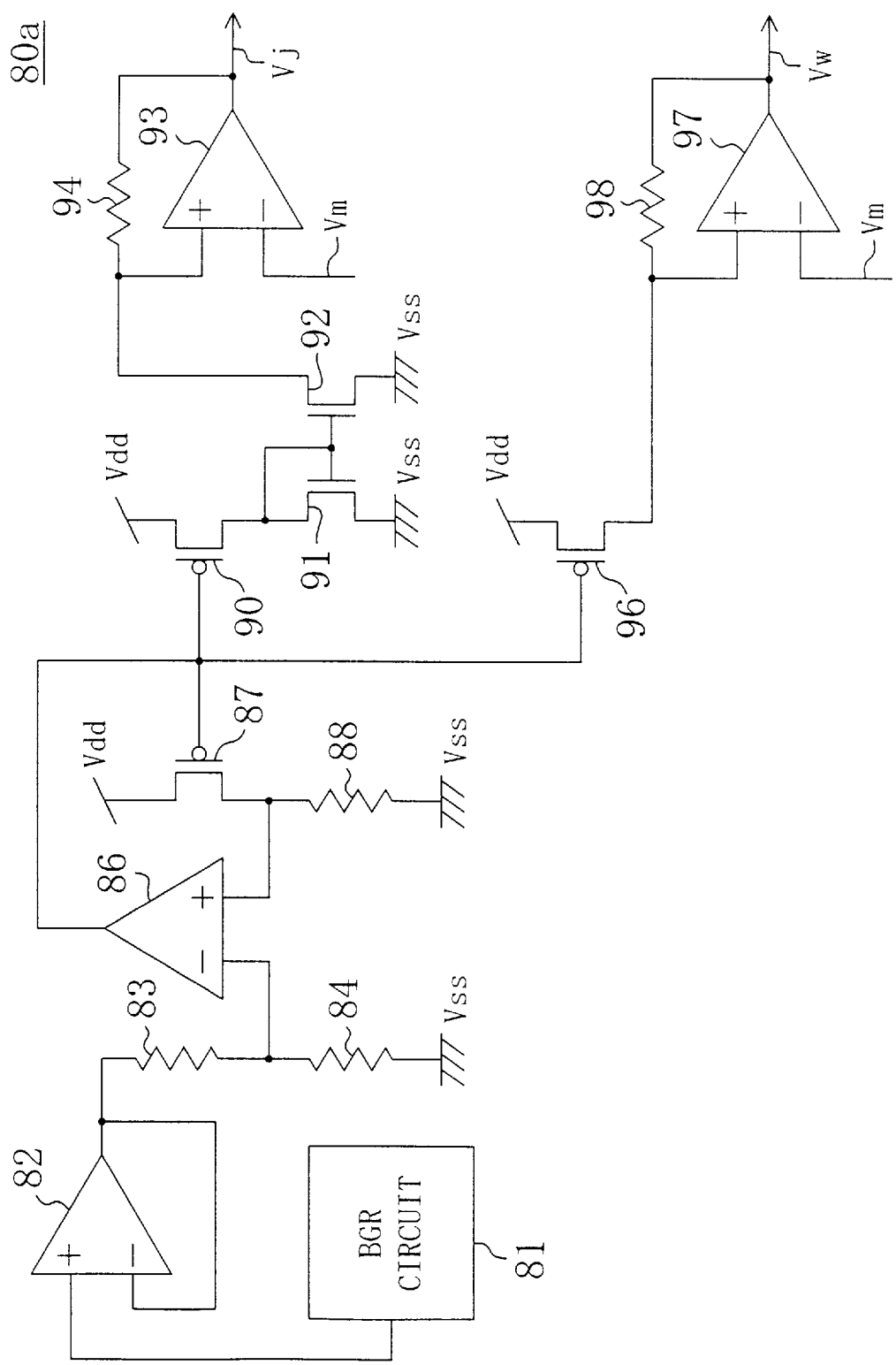
FIG. 7 is a circuit diagram showing a variation example of FIG. 6.

Referring now to FIG. 7, there is shown a variation example of FIG. 6. A variable voltage generation circuit 80a of FIG. 7, which is provided with first and second replica resistors 94 and 98 forming a replica of the terminating resistor Rt, flows a constant current into each of the replica resistors 94 and 98, and generates (a) the first variable voltage Vj by adding a voltage drop in the first replica resistor 94 to the bias voltage Vm and (b) the second variable voltage Vw by subtracting a voltage drop in the second replica resistor 98 from the bias voltage Vm. 96 is a PMOS transistor and 97 is an operational amplifier.

Figure 8:
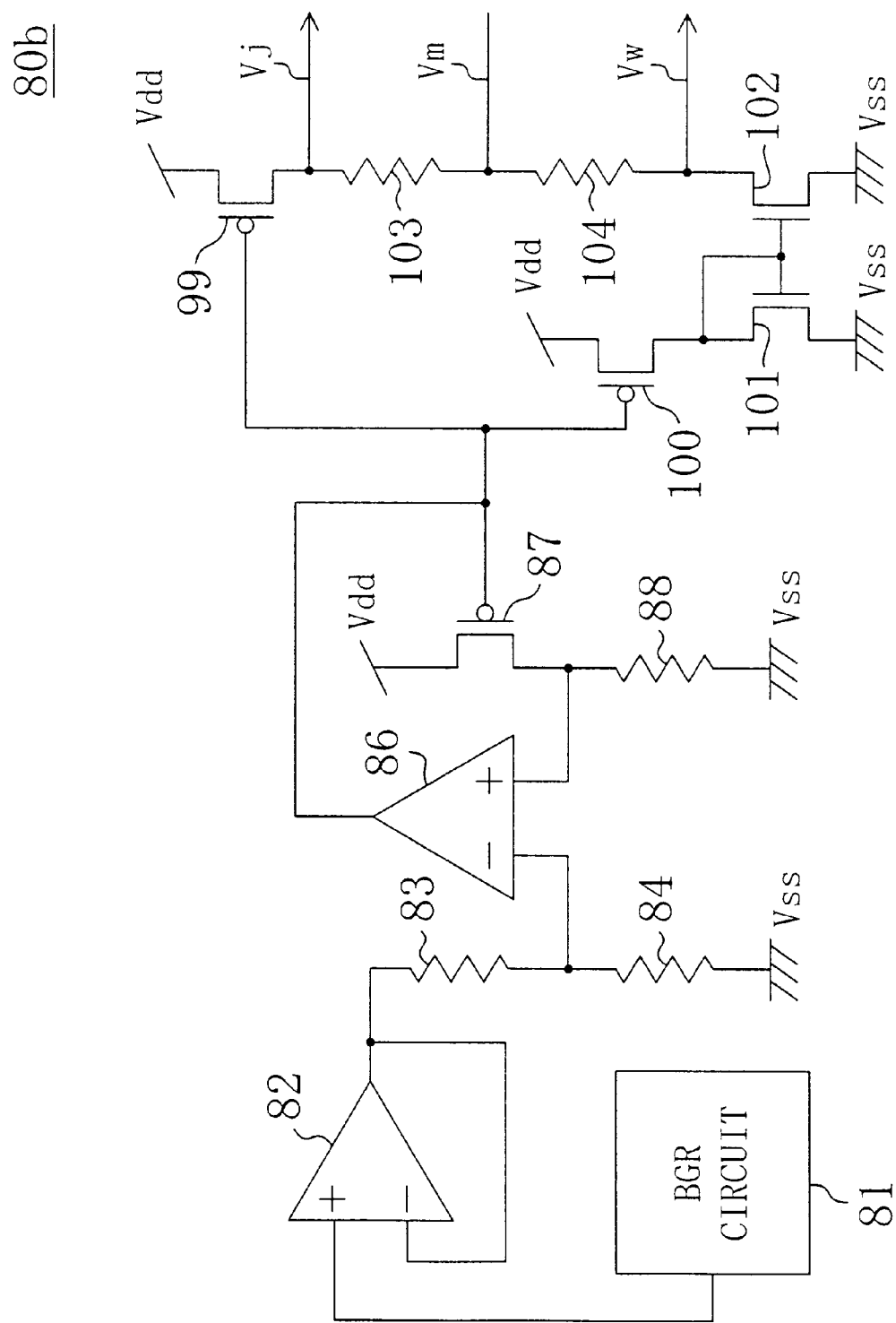
FIG. 8 is a circuit diagram showing another variation example of FIG. 6.

Referring to FIG. 8, there is shown another variation example of FIG. 6. A variable voltage generation circuit 80b of FIG. 8, which is provided with first and second replica resistors 103 and 104 forming a replica of the terminating resistor Rt, flows a constant current into both the replica resistors 103 and 104, and generates (a) the first variable voltage Vj by adding a voltage drop in the first replica resistor 103 to the bias voltage Vm and (b) the second variable voltage Vw by subtracting a voltage drop in the second replica resistor 104 from the bias voltage Vm. 99 and 100 are PMOS transistors and 101 and 102 are NMOS transistors.

Figure 9:
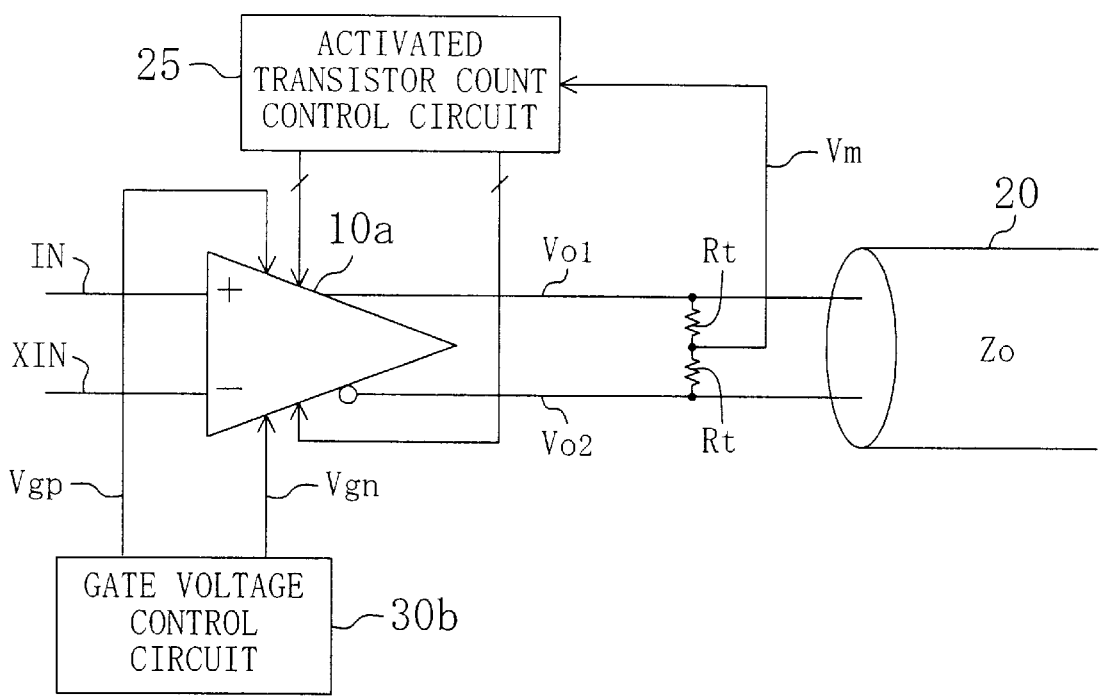
FIG. 9 is a block diagram showing another example of the configuration of the constant-current output circuit according to the present invention.

FIG. 9 shows another example of the configuration of the constant-current output circuit according to the present invention. A driver 10a, an activated transistor count control circuit 25, and a gate voltage control circuit 30b, which are shown in FIG. 9, together form a constant-current output circuit for outputting a constant current to the cable 20. The driver 10a is a driver having a plurality of drive transistors connected together in parallel. The activated transistor count control circuit 25 is a circuit for performing digital control of the number of drive transistors of the driver 10a which are subjected to activation, according to the bias voltage Vm of the cable 20. The gate voltage control circuit 30b is a circuit for performing analog control of the gate voltage of a particular drive transistor in the driver 10a.

Figure 10:
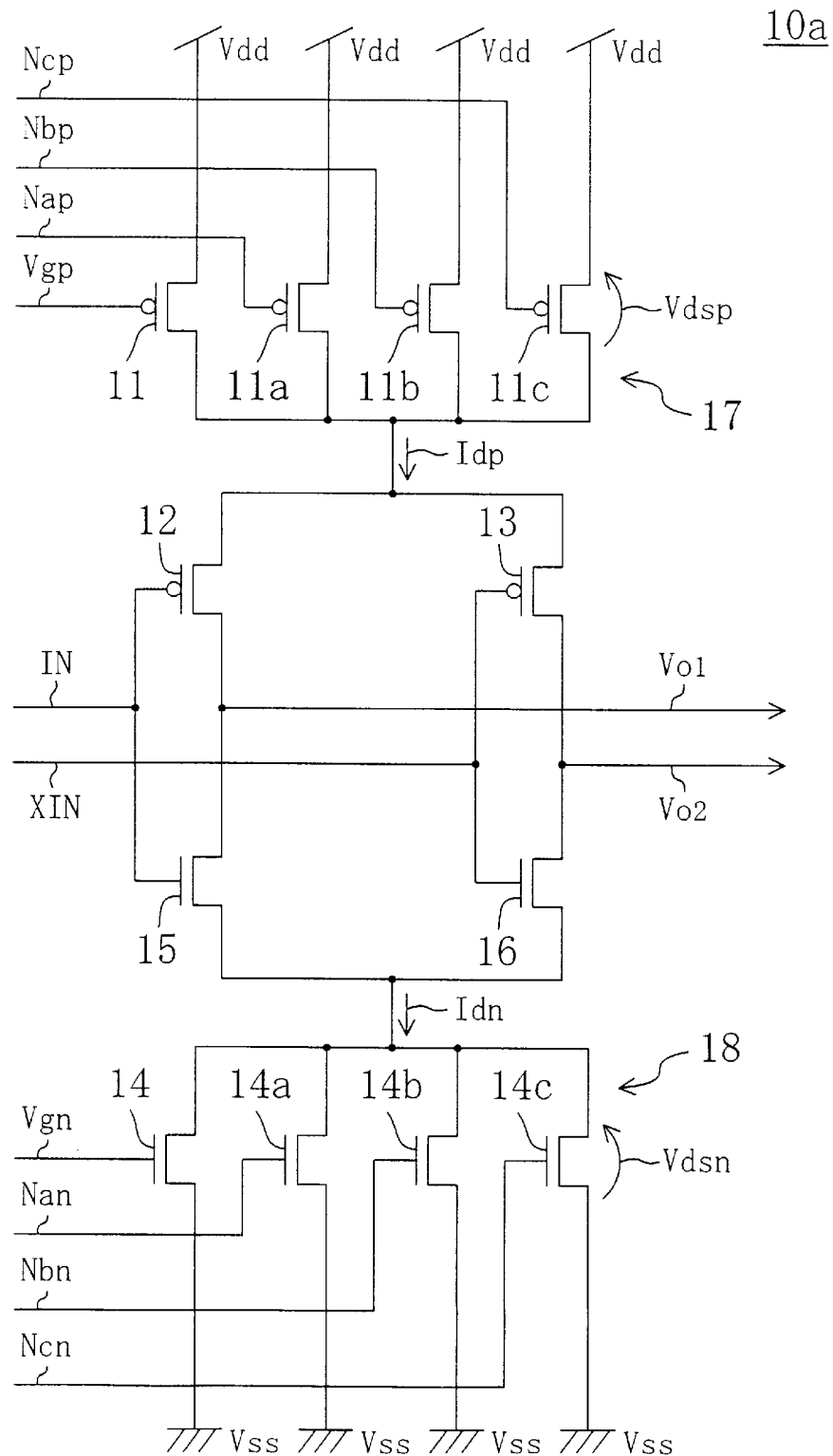
FIG. 10 is a circuit diagram showing an internal configuration of a driver in FIG. 9.

Referring to FIG. 10, there is illustrated an internal configuration of the driver 10a in FIG. 9. The driver 10a has first to fourth PMOS drive transistors 11, 11a, 11b, and 11c which have source electrodes coupled to the power supply Vdd common thereto and drain electrodes coupled together in common, and first to fourth NMOS drive transistors 14, 14a, 14b, and 14c which have source electrodes coupled to the power supply Vss common thereto and drain electrodes coupled together in common. The first PMOS drive transistor 11 has a gate electrode which receives the infinitely-controlled gate voltage Vgp and the second to fourth PMOS drive transistors 11a, 11b, and 11a have gate electrodes which receive activation logical signals Nap, Nbp, and Ncp, respectively. The drain electrode common to these four PMOS drive transistors 11, 11a, 11b, and 11c is coupled, through the first PMOS switching transistor 12, to a first signal line of the cable 20 as well as to a second signal line of the cable 20 through the second PMOS switching transistor 13. Accordingly, these four PMOS drive transistors 11, 11a, 11b, and 11c together form a PMOS driver 17 for flowing the current Idp into the cable 20. The first NMOS drive transistor 14 has a gate electrode which receives the infinitely-controlled gate voltage Vgn and the second to fourth NMOS drive transistors 14a, 14b, and 14a have gate electrodes which receive activation logical signals Nan, Nbn, and Ncn, respectively. The drain electrode common to these four NMOS drive transistors 14, 14a, 14b, and 14c is coupled, through the first NMOS switching transistor 15, to the first signal line of the cable 20 as well as to the second signal line of the cable 20 through the second NMOS switching transistor 16. Accordingly, these four NMOS drive transistors 14, 14a, 14b, and 14c together form an NMOS driver 18 for drawing the current Idn from the cable 20. The activation logical signals Nap, Nbp, Ncp, Nan, Nbn and Ncn are applied from the activated transistor count control circuit 25, while the gate voltages Vgp and Vgn are applied from the gate voltage control circuit 30b. Here, the voltage between the common drain and source electrodes of the four PMOS drive transistors 11, 11a, 11b, and 11c, is represented as Vdsp and the voltage between the common drain and source electrodes of the four NMOS drive transistors 14, 14a, 14b, and 14c, is represented as Vdsn.

Figure 11:
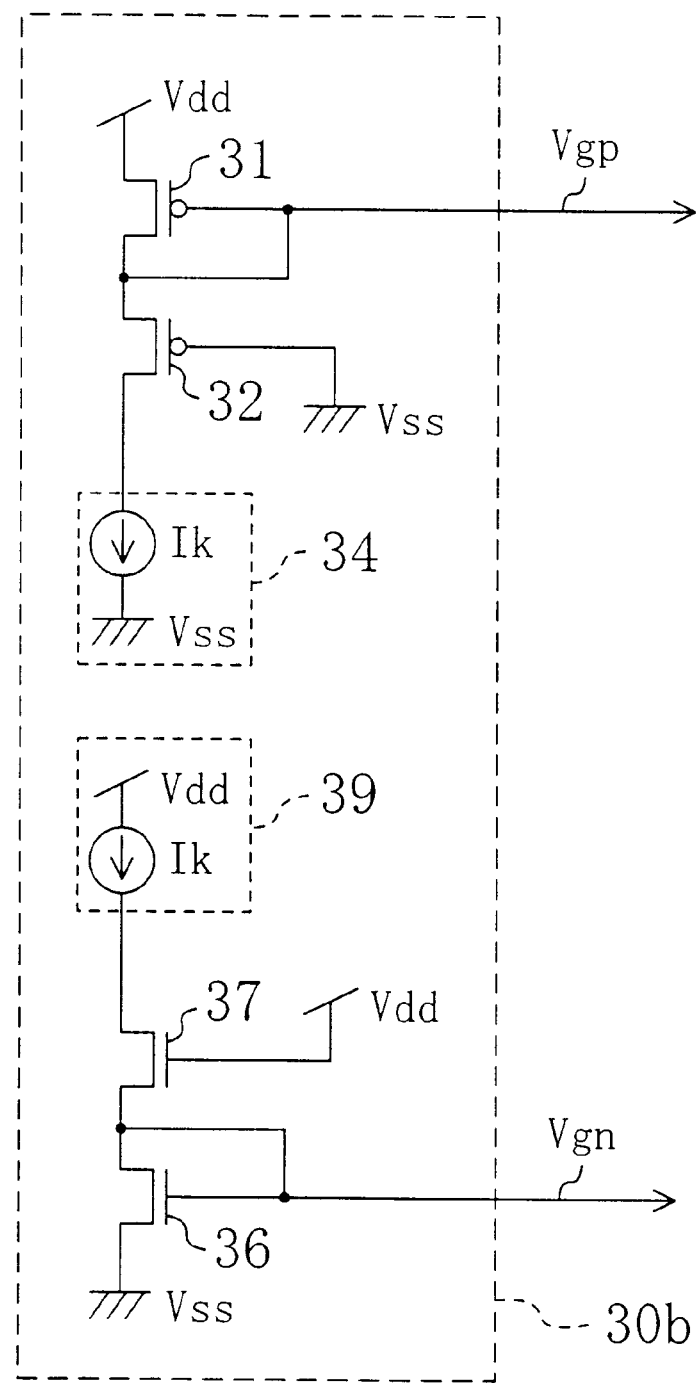
FIG. 11 is a circuit diagram showing an internal configuration of a gate voltage control circuit in FIG. 9.

FIG. 11 shows an internal configuration of the gate voltage control circuit 30b in FIG. 9. The gate voltage control circuit 30b of FIG. 11 is a circuit formed by omission of the operational amplifiers 35 and 40 and the variable voltage control circuit 80 from the configuration of the gate voltage control circuit 30a of FIG. 5. The PMOS replica transistor 31 has drain and gate electrodes mutually shorted and the voltage of these electrodes, Vgp, is applied to the gate electrode of the first PMOS drive transistor 11. The NMOS replica transistor 36 has drain and gate electrodes mutually shorted and the voltage of these electrodes, Vgn, is applied to the gate electrode of the first NMOS drive transistor 14.

Figure 12:
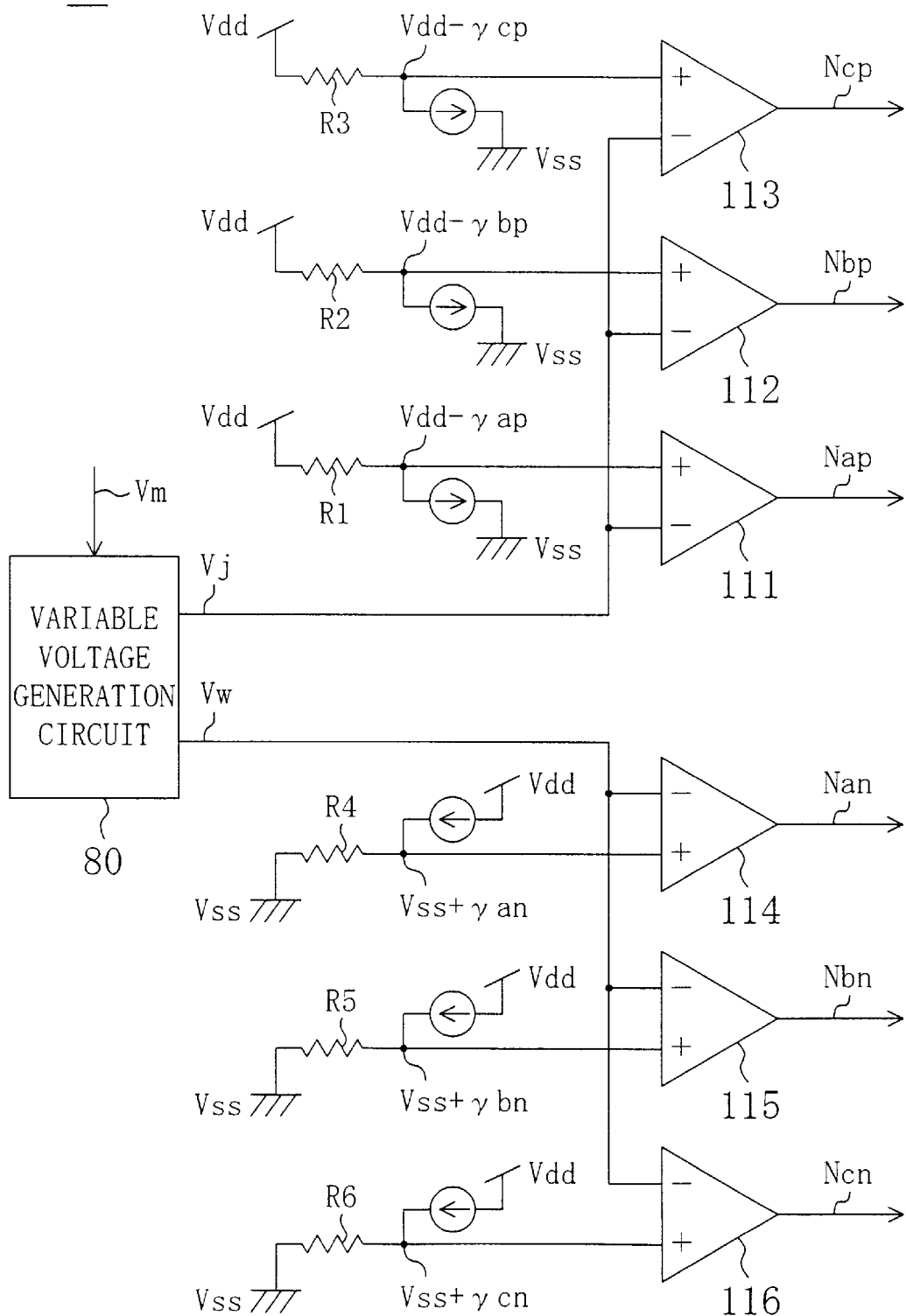
FIG. 12 is a circuit diagram showing an internal configuration of an activated transistor count control circuit in FIG. 9.

Referring now to FIG. 12, there is shown an internal configuration of the activated transistor count control circuit 25. The activated transistor count control circuit 25 of FIG. 12 has the variable voltage generation circuit 80 (see FIGS. 5–8) for detecting the cable bias voltage Vm and for generating from the detected bias voltage Vm the first and second variable voltages Vj and Vw, and first to sixth comparators 111–116.

First, the operation of each of the first to third comparators 111–113 will be described. The first comparator 111 provides, when the first variable voltage Vj satisfies the condition that Vj>Vdd−γap, the activation logical signal Nap of L level to the gate electrode of the second PMOS drive transistor 11a, otherwise providing the activation logical signal Nap of H level. The second comparator 112 provides, when Vj satisfies the condition that Vj>Vdd−γbp, the activation logical signal Nbp of L level to the gate electrode of the third PMOS drive transistor 11b, otherwise providing the activation logical signal Nbp of H level. The third comparator 113 provides, when Vj satisfies the condition that Vj>Vdd−γcp, the activation logical signal Ncp of L level to the gate electrode of the fourth PMOS drive transistor 11c, otherwise providing the activation logical signal Ncp of H level. Here, when voltage drops, caused by flow of a constant current through resistors R1, R2, and R3, are γap, γbp, and γcp, it is possible to generate, by making utilization of these voltage drops, a voltage of Vdd−γap, a voltage of Vdd−γbp, and a voltage of Vdd−γcp. The values of the resistors R1, R2, and R3 are set in such a way as to satisfy γap=Vswp+Vap, γbp=Vswp+Vbp, and γcp=Vswp+Vcp, where Vswp is the on voltage of the first and second PMOS switching transistors 12 and 13 and Vap, Vbp, and Vcp are set voltages (for example, Vap=0.8V; Vbp=0.4V; and Vcp=0.2V). The number of transistors of the driver 10a which are subjected to activation is determined according to the bias voltage Vm such that, since the voltage Vdsp in FIG. 10 is equal to Vdd−Vswp−Vj, (i) all of the second to fourth PMOS drive transistors 11a, 11b, and 11c turn off if Vdsp≧Vap, (ii) the second PMOS drive transistor 11a turns on if Vbp≦Vdsp<Vap, (iii) the second and third PMOS transistors 11a and 11b turn on if Vcp≦Vdsp<Vbp, and (iv) the second, third and fourth PMOS drive transistors 11a, 11b, and 11c turn on if Vdsp<Vcp.

Second, the operation of each of the fourth to sixth comparators 114–116 will be described. The fourth comparator 114 provides, when the second variable voltage Vw satisfies the condition that Vw<Vss+γan, the activation logical signal Nan of H level to the gate electrode of the second NMOS drive transistor 14a, otherwise providing the activation logical signal Nan of L level. The fifth comparator 115 provides, when Vw satisfies the condition that Vw<Vss+γbn, the activation logical signal Nbn of H level to the gate electrode of the third NMOS drive transistor 14b, otherwise providing the activation logical signal Nbn of L level. The sixth comparator 116 provides, when Vw satisfies the condition that Vw<Vss+γcn, the activation logical signal Ncn of H level to the gate electrode of the fourth NMOS drive transistor 14c, otherwise providing the activation logical signal Ncn of L level. Here, when voltage drops, caused by flow of a constant current through resistors R4, R5, and R6, are γan, γbn, and γcn, it is possible to generate, by making utilization of these voltage drops, a voltage of Vss+γan, a voltage of Vss+γbn, and a voltage of Vss+γcn. The values of the resistors R4, R5, and R6 are set in such a way to satisfy γan=Vswn+Van, γbn=Vswn+Vbn, and γcn=Vswn+Vcn, where Vswn is the on voltage of the first and second NMOS switching transistors 15 and 16 and Van, Vbn, and Vcn (Van>Vbn>Vcn) are set voltages. The number of transistors of the driver 10a which are subjected to activation is determined according to the bias voltage Vm such that, since the voltage Vdsn in FIG. 10 is equal to Vw−Vswn−Vss, (i) all of the second to fourth NMOS drive transistors 14a, 14b, and 14c turn off if Vdsn≧Van, (ii) the second NMOS drive transistor 14a turns on if Vbn≦Vdsn<Van, (iii) the second and third NMOS drive transistors 14a and 14b turn on if Vcn≦Vdsn<Vbn, and (iv) the second, third and fourth NMOS drive transistors 14a, 14b, and 14c turn on if Vdsn<Vcn.

Figure 13:
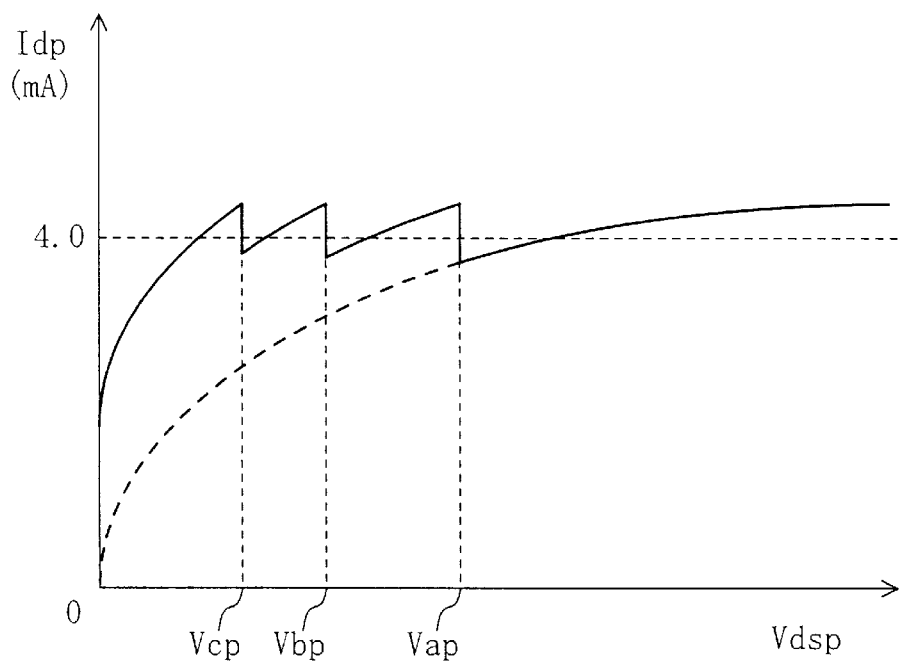
FIG. 13 is a diagram showing the voltage-current characteristics of a PMOS driver in FIG. 10.

FIG. 13 shows the voltage-current characteristics of the PMOS driver 17 in FIG. 10. According to this example, if Vdsp≧Vap, then the first PMOS drive transistor 11 bears all of the output current Idp of the PMOS driver 17, as in the conventional technology. However, if Vdsp<Vap, the number of transistors of the PMOS driver 17 which are subjected to activation increases as Vdsp decreases. Accordingly, as indicated by a solid line in the figure, the output current Idp of the PMOS driver 17 can maintain an approximately constant value.

Figure 14:
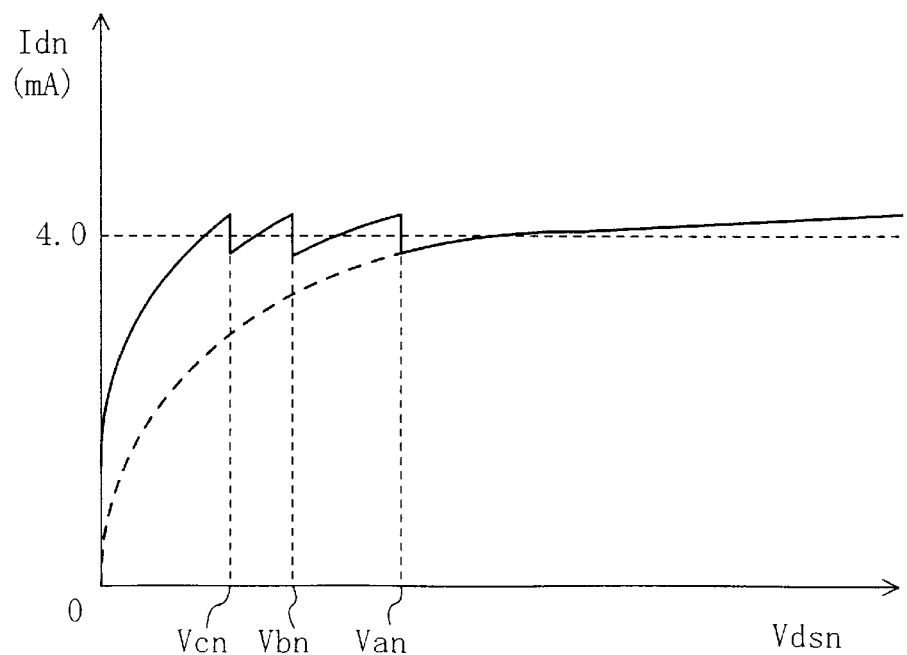
FIG. 14 is a diagram showing the voltage-current characteristics of an NMOS driver in FIG. 10.

FIG. 14 shows the voltage-current characteristics of the NMOS driver 18 in FIG. 10. According to this example, if Vdsn≧Van, then the first NMOS drive transistor 14 bears all of the output current Idn of the NMOS driver 18, as in the conventional technology. However, if Vdsn<Van, the number of transistors of the NMOS driver 18 which are subjected to activation increases as Vdsn decreases. Accordingly, the output current Idn of the NMOS driver 18 can maintain an approximately constant value.

The number of drive transistors forming each of the PMOS driver 17 and the NMOS driver 18 is arbitrary. The gate width of each drive transistor can be set according to circumstances. Moreover, gate voltages of different magnitudes may be used to activate each drive transistor.

Figure 15:
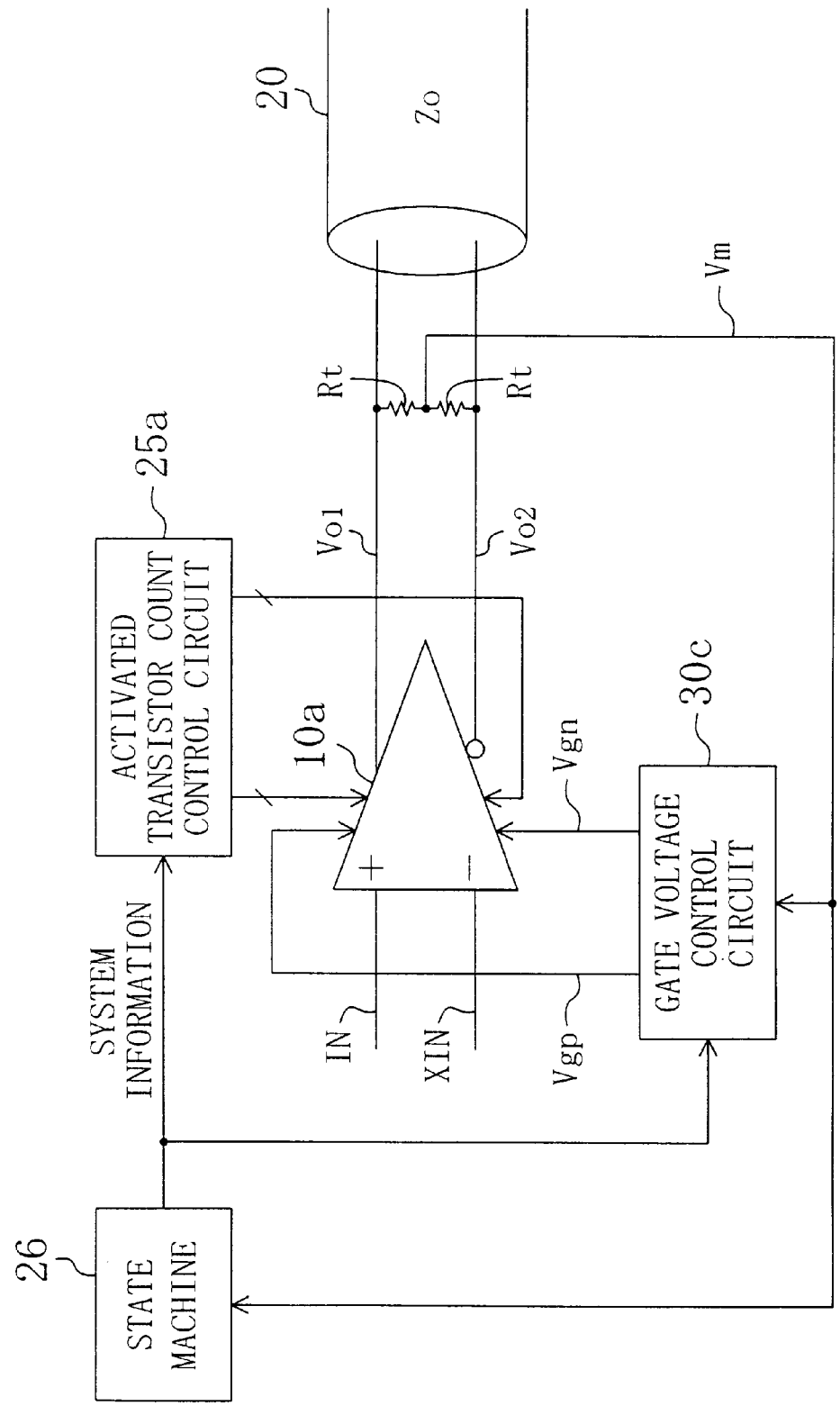
FIG. 15 is a block diagram showing still another example of the configuration of the constant-current output circuit according to the present invention.

FIG. 15 shows still another example of the configuration of the constant-current output circuit according to the present invention. A driver 10a, an activated transistor count control circuit 25a, a gate voltage control circuit 30c, and a state machine 26 in FIG. 15 together form a constant-current output circuit for outputting a constant current to the cable 20. The driver 10a is a driver having an internal configuration as described in FIG. 10. The state machine 26 is for providing system information indicative of a prediction of the change in the bias voltage Vm to the activated transistor count control circuit 25a and to the gate voltage control circuit 30c. The system information is prepared from a real change detection result of the bias voltage Vm of the cable 20 or from information not based on the detection of the bias voltage Vm, which will be described later. The activated transistor count control circuit 25a is a circuit for providing the activation logical signals Nap, Nbp, Ncp, Nan, Nbn, and Ncn according to the system information given from the state machine 26 to the driver 10a so as to perform digital control of the number of transistors of the driver 10a which are subjected to activation. The gate voltage control circuit 30c is implemented by function extending, for example, the gate voltage control circuit 30 in FIG. 1 or the gate voltage control circuit 30a shown in FIG. 5, and is a circuit for performing analog control of the gate voltages Vgp and Vgn of particular drive transistors in the driver 10a either according to the bias voltage Vm of the cable 20 or according to the system information given from the state machine 26.

Figure 16:
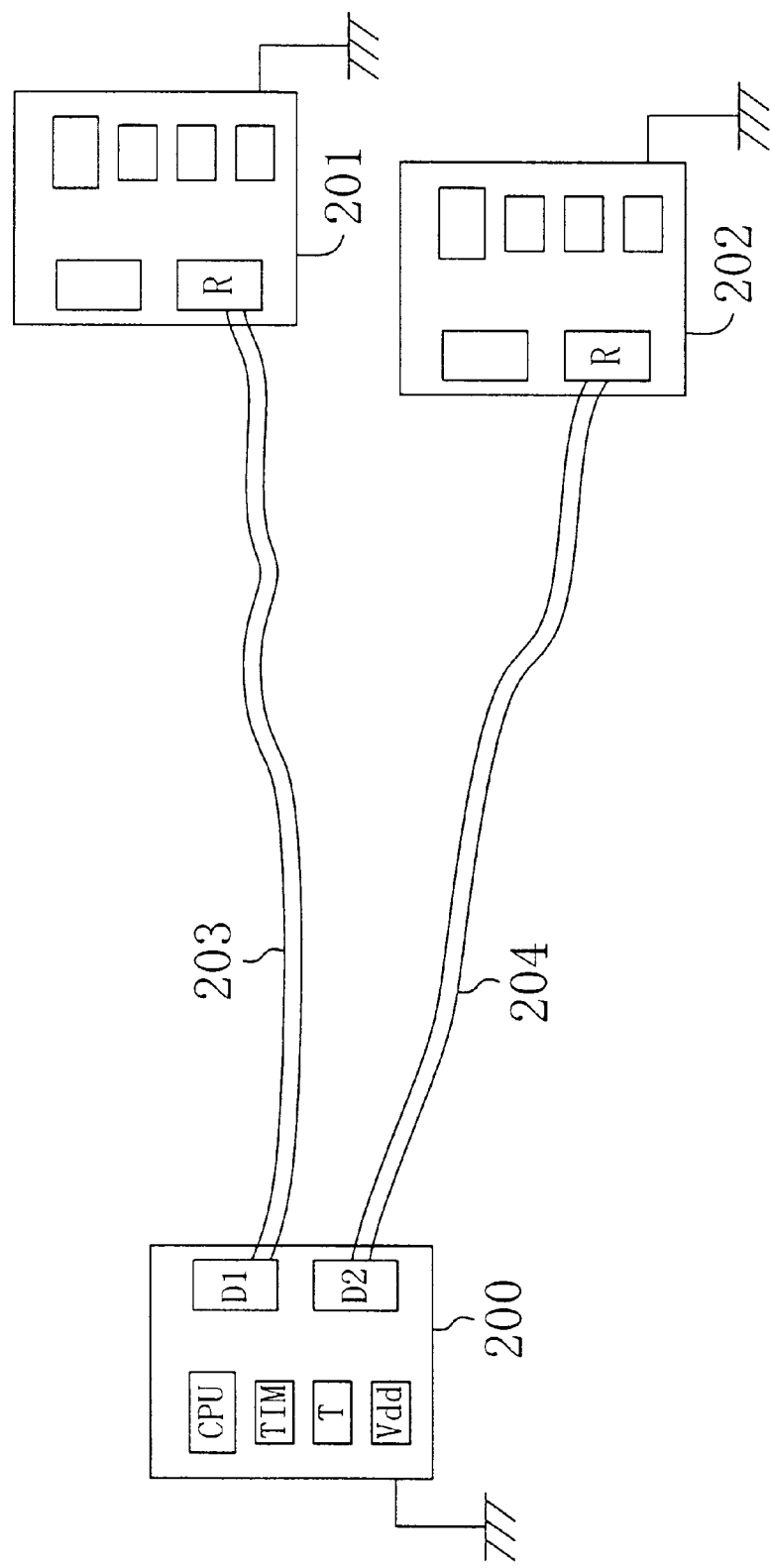
FIG. 16 is a block diagram showing an example of the configuration of a data transmission system making utilization of the constant-current output circuit of FIG. 15.

FIG. 16 shows an example of the configuration of a data transmission system making utilization of the constant-current output circuit of FIG. 15. In the system of FIG. 16, a transfer of data can be done from a driver D1 of first equipment 200 to a receiver R of second equipment 201 through a first twisted-pair cable 203 and another transfer of data can be done from a driver D2 of the first equipment 200 to a receiver R of third equipment 202 through a second twisted-pair cable 204. For example, the driver D1 has the configuration of FIG. 15. In the present system, by changing the cable bias voltage Vm, the speed signalling information for setting a data transmission rate and the power management information for shifting the present system to a sleep state can be transmitted. The foregoing system information (FIG. 15) indicative of a prediction of the change in the bias voltage Vm is prepared from a result of the real change detection of the bias voltage Vm in transferring the speed signalling information, the power management information, and the like, or from the information independent of the detection of the bias voltage Vm such as timer (TIM), power-supply voltage change (Vdd), and temperature change (T) and the like.

Figure 17:
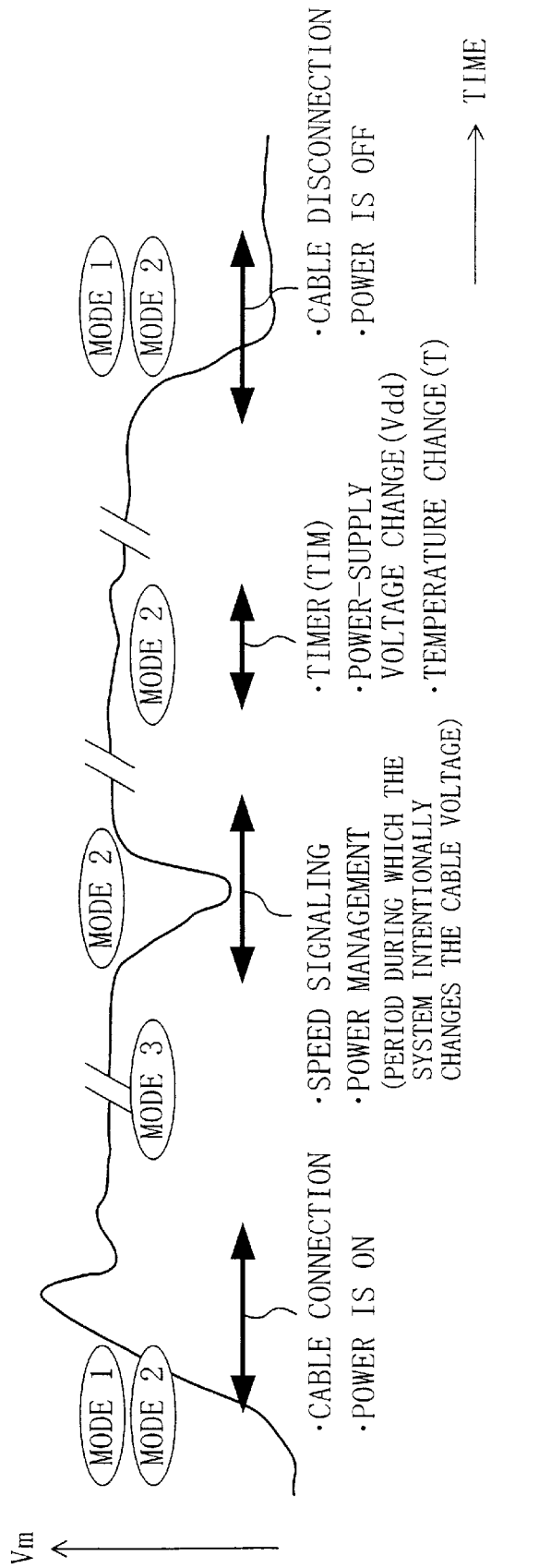
FIG. 17 is a time chart diagram showing a change in cable bias voltage in the system of FIG. 16.

FIG. 17 illustrates a change in the cable bias voltage Vm in the system of FIG. 16. Moreover, FIG. 17 shows three modes of the present system. MODE 1 is a mode in which cable connection or disconnection, or the on-off of an equipment power supply occurs. MODE 2 is a mode in which there occurs a change in the bias voltage Vm. For example, there may be a case in which the bias voltage Vm undergoes a great change due to a human-initiated operation in MODE 1 or there may be another case in which the bias voltage Vm is intentionally varied to a great extent for the transfer of the speed signalling information and the power management information. Moreover, there may be still another case in which the bias voltage Vm changes due to the change in equipment power-supply voltage and the change in equipment temperature. MODE 3 is a mode in which a valid transfer of data is carried out.

Figure 18:
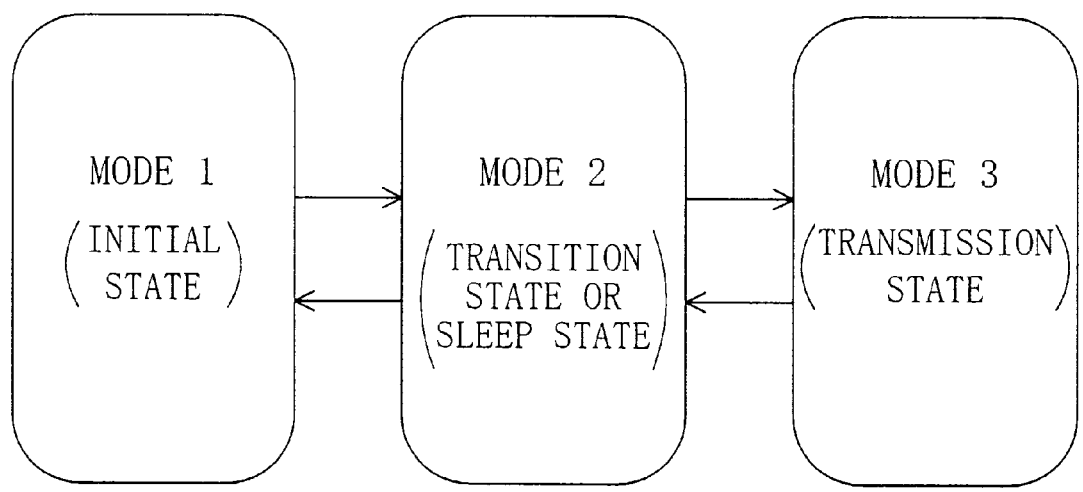
FIG. 18 is a state transition diagram of a state machine in FIG. 15.

FIG. 18 shows a state transition of the state machine 26 in FIG. 15. The state machine 26 detects transition between MODE 1, MODE 2, and MODE 3. At the time of cable connection and at the time when an equipment power supply is turned on, the bias voltage Vm undergoes a sudden change. In such a case, the state machine 26 detects a transition from MODE 1 (the initial state) to MODE 2 (the transition state) at the point in time the bias voltage Vm rises slightly and prepares the system information indicative of a prediction of the change in the bias voltage Vm. In response to the system information thus prepared, the activated transistor count control circuit 25a and the gate voltage control circuit 30c make adjustment to the current drive capability of the driver 10a. However, in the case the bias voltage Vm changes so suddenly that feedback control of the gate voltages Vgp and Vgn is made incapable of following such a sudden change, it may be arranged such that in order to prevent unstable operations, the operation of the gate voltage control circuit 30c is frozen and only the activated transistor count control circuit 25a is made to operate. Moreover, it may be arranged such that the gate voltage control circuit 30c changes the gate voltages Vgp and Vgn according to the system information. Then, the transfer of data starts when the bias voltage Vm comes to have a regular value. In such a case, the state machine 26 detects a transition from MODE 2 (the transition state) to MODE 3 (the transmission state). In MODE 3, it is the gate voltage control circuit 30c that mainly adjusts the current drive capability of the driver 10a so as to compensate slight variations in the bias voltage Vm. It may be arranged such that the state machine 26 causes, according to the timer information, the gate voltage control circuit 30c to intermittently operate. At the time when the speed signalling information is transferred, the bias voltage Vm undergoes a great change. In such a case, the state machine 26 detects, based on a result of the real change detection of the bias voltage Vm, a transition from MODE 3 (the transmission state) to MODE 2 (the transition state) and prepares the system information indicative of a prediction of the change in the bias voltage Vm. Moreover, if the bias voltage Vm changes greatly when the power management information is transferred, then the state machine 26 detects, based on a result of the real change detection, a transition from MODE 3 (the transmission state) to MODE 2 (the sleep state) and prepares the system information indicative of a prediction of the change in the bias voltage Vm. Further, also when there occurs a power-supply voltage change or a temperature change in MODE 3, the state machine 26 prepares the system information indicative of a prediction of the change in the bias voltage Vm. The activated transistor count control circuit 25a and the gate voltage control circuit 30c adjust, in response to these system information pieces, the current drive capability of the driver 10a. Also at the time of cable disconnection and at the time when the equipment power source is turned off, adjustment to the current drive capability of the driver 10a is made in response to the system information indicative of a prediction of the change in the bias voltage Vm.

Several examples of the constant-current output circuit for differential data transmission have been described. However, the present invention is applicable to a constant-current output circuit for the single-ended transmission of data.

What is claimed is:

1. A constant-current output circuit for outputting a constant current to a cable coupled to a bias voltage through a terminating resistor, said constant-current output circuit comprising:

a drive transistor having a gate electrode, a source electrode coupled to a power supply, and a drain electrode coupled to said cable; and adjustment means for adjusting the current drive capability of said drive transistor so that when a voltage between said drain electrode and said source electrode undergoes a variation due to a change in said bias voltage, a variation in drain current of said drive transistor accompanied by said drain-source voltage variation is compensated such that said drain current of said drive transistor is maintained at a substantially same level so as to generate said constant current, wherein said adjustment means has a function of adjusting, based on system information indicative of a prediction of the change in said bias voltage, the current drive capability of said drive transistor.

2. A constant-current output circuit for outputting a constant current to a cable coupled to a bias voltage through a terminating resistor, said constant-current output circuit comprising:

a drive transistor having a gate electrode, a source electrode coupled to a power supply, and a drain electrode coupled to said cable; and adjustment means for adjusting the current drive capability of said drive transistor so that when a voltage between said drain electrode and said source electrode undergoes a variation due to a change in said bias voltage, a variation in drain current of said drive transistor accompanied by said drain-source voltage variation is compensated such that said drain current of said drive transistor is maintained at a substantially same level so as to generate said constant current, wherein said adjustment means has a gate voltage control circuit for voltage control of said gate electrode of said drive transistor, said gate voltage control circuit having:
  means for detecting said bias voltage, said detecting means comprising said terminating resistor;
  a series circuit disposed between said power supply and a reference node and constructed of a replica transistor forming a replica of said drive transistor and a replica resistor forming a replica of said terminating resistor;
  a current source from which a constant current flows into said series circuit; and means for making a comparison between a voltage at said reference node and said detected bias voltage, for controlling, based on a result of said comparison, a gate voltage of said replica transistor, and for providing said controlled gate voltage to said gate electrode of said drive transistor.

3. The constant-current output circuit according to claim 2, wherein said constant-current output circuit further comprises a switching transistor serially connected between said drive transistor and said cable; and wherein said gate voltage control circuit further has another replica transistor, which is serially connected between said replica transistor and said replica resistor, said another replica transistor forming a replica of said switching transistor.

4. A constant-current output circuit for outputting a constant current to a cable coupled to a bias voltage through a terminating resistor, said constant-current output circuit comprising:

a drive transistor having a gate electrode, a source electrode coupled to a power supply, and a drain electrode coupled to said cable; and adjustment means for adjusting the current drive capability of said drive transistor so that when a voltage between said drain electrode and said source electrode undergoes a variation due to a change in said bias voltage, a variation in drain current of said drive transistor accompanied by said drain-source voltage variation is compensated such that said drain current of said drive transistor is maintained at a substantially same level so as to generate said constant current, wherein said adjustment means has a gate voltage control circuit for voltage control of said gate electrode of said drive transistor, said gate voltage control circuit having:
  means for detecting said bias voltage;
  a replica transistor, disposed between said power supply and a reference node, for forming a replica of said drive transistor;
  a current source from which a constant current flows into said replica transistor;
  a variable voltage generation circuit for generating, from said detected bias voltage, a variable voltage wherein a difference of said variable voltage with respect to said bias voltage represents a voltage drop across said terminating resistor; and
  means for making a comparison between a voltage at said reference node and said generated variable voltage, for controlling, based on a result of said comparison, a gate voltage of said replica transistor, and for providing said controlled gate voltage to said gate electrode of said drive transistor.

5. The constant-current output circuit according to claim 4, wherein said constant-current output circuit further comprises a switching transistor serially connected between said drive transistor and said cable; and wherein said gate voltage control circuit further has another replica transistor, which is serially connected between said replica transistor and a replica resistor, said another replica transistor forming a replica of said switching transistor.

6. The constant-current output circuit according to claim 4, said variable voltage generation circuit having:
  a replica resistor for forming a replica of said terminating resistor; and
  means for adding a voltage drop across said replica resistor occurring when a constant current flows in said replica resistor to said detected bias voltage or for subtracting such a voltage drop across said replica resistor from said detected bias voltage.

7. A constant-current output circuit for outputting a constant current to a cable coupled to a bias voltage through a terminating resistor, said constant-current output circuit comprising:

a driver including a plurality of drive transistors having respective gate electrodes, source electrodes coupled to a power supply common thereto, and drain electrodes coupled in common to said cable; and adjustment means for adjusting the current drive capability of said driver so that when a voltage between said common drain electrode and said common source electrode undergoes a variation due to a change in said bias voltage, a variation in output current of said driver accompanied by said drain-source voltage variation is compensated thereby to establish a substantial correspondence between said output current of said driver and said constant current.

8. The constant-current output circuit according to claim 7, wherein said adjustment means has a function of adjusting, based on a result of the detection of changes in said bias voltage, the current drive capability of said driver.

9. The constant-current output circuit according to claim 7, wherein said adjustment means has a function of adjusting, based on system information indicative of a prediction of the change in said bias voltage, the current drive capability of said driver.

10. The constant-current output circuit according to claim 7, wherein said adjustment means has an activated transistor count control circuit for controlling the number of transistors of said plurality of drive transistors which are subjected to activation.

11. The constant-current output circuit according to claim 10,
   said activated transistor count control circuit having:
      means for detecting said bias voltage; and
      means for determining, according to said detected bias voltage, the number of transistors of said plurality of drive transistors which are subjected to activation.

12. The constant-current output circuit according to claim 10, wherein said activated transistor count control circuit has means for determining, based on system information indicative of a prediction of the change in said bias voltage, the number of transistors of said plurality of drive transistors which are subjected to activation.

13. The constant-current output circuit according to claim 10, wherein said activated transistor count control circuit has logical means for providing a respective activation logical signal to each of gate electrodes of transistors of said plurality of drive transistors which are subjected to activation.

14. The constant-current output circuit according to claim 7, wherein said adjustment means has a gate voltage control circuit for voltage control of a gate electrode of a particular transistor of said plurality of drive transistors.

15. The constant-current output circuit according to claim 14,
   said gate voltage control circuit having:
      means for detecting said bias voltage; and
      means for determining, according to said detected bias voltage, a voltage to be applied to said gate electrode of said particular transistor.

16. The constant-current output circuit according to claim 14, wherein said gate voltage control circuit has means for determining, based on system information indicative of a prediction of the change in said bias voltage, a voltage to be applied to said gate electrode of said particular transistor.

17. A data transmission system comprising:
   a cable coupled to a bias voltage through a terminating resistor; and
   a constant-current output circuit for outputting a constant current to said cable;
   said constant-current output circuit having:
      a drive transistor having a gate electrode, a source electrode coupled to a power supply, and a drain electrode coupled to said cable; and
      adjustment means for adjusting the current drive capability of said drive transistor so that when a voltage between said drain electrode and said source electrode undergoes a variation due to a change in said bias voltage, a variation in drain current of said drive transistor accompanied by said drain-source voltage variation is compensated such that said drain current of said drive transistor is maintained at a substantially same level so as to generate said constant current,
   wherein said adjustment means has a gate voltage control circuit for voltage control of said gate electrode of said drive transistor,
   said gate voltage control circuit having;
      means for detecting said bias voltage, said detecting means comprising said terminating resistor;
      series circuit disposed between said power supply and a reference node and constructed of a replica transistor forming a replica of said drive transistor and a replica resistor forming a replica of said terminating resistor;
      a current source from which a constant current flows into said series circuit; and means for making a comparison between a voltage at said reference node and said detected bias voltage, for controlling, based on a result of said comparison, a gate voltage of said replica transistor, and for providing said controlled gate voltage to said gate electrode of said drive transistor.

18. The data transmission system according to claim 17, wherein said cable is a twisted-pair cable.

19. A data transmission system comprising:
   a cable coupled to a bias voltage through a terminating resistor; and
   a constant-current output circuit for outputting a constant current to said cable;
   said constant-current output circuit having:
      a driver including a plurality of drive transistors having respective gate electrodes, source electrodes coupled to a power supply common thereto, and drain electrodes coupled in common to said cable; and
      adjustment means for adjusting the current drive capability of said driver so that when a voltage between said common drain electrode and said common source electrode undergoes a variation due to a change in said bias voltage, a variation in output current of said driver accompanied by said drain-source voltage variation is compensated such that said output current of said driver is maintained at a substantially same level so as to generate said constant current.

* * * * *